United States Patent
Kappel (10) Patent No.: US 11,367,804 B2
(45) Date of Patent: Jun. 21, 2022

(54) DIRECTIONAL PHOTODETECTOR AND OPTICAL SENSOR ARRANGEMENT

(71) Applicant: ams AG, Premstätten (AT)

(72) Inventor: Robert Kappel, Wettmannstaetten (AT)

(73) Assignee: AMS AG, Premstaetten (AT)

( * ) Notice: Subject to any disclaimer, the term of this patent is extended or adjusted under 35 U.S.C. 154(b) by 468 days.

(21) Appl. No.: 16/311,245

(22) PCT Filed: Jun. 16, 2017

(86) PCT No.: PCT/EP2017/064782
§ 371 (c)(1),
(2) Date: Dec. 19, 2018

(87) PCT Pub. No.: WO2017/220442
PCT Pub. Date: Dec. 28, 2017

(65) Prior Publication Data
US 2019/0237610 A1    Aug. 1, 2019

(30) Foreign Application Priority Data

Jun. 20, 2016 (EP) ..................................... 16175249

(51) Int. Cl.
  *H01L 31/107* (2006.01)
  *H01L 31/0232* (2014.01)
  *H01L 27/146* (2006.01)
(52) U.S. Cl.
  CPC .... *H01L 31/1075* (2013.01); *H01L 27/14643* (2013.01); *H01L 31/02325* (2013.01); *H01L 31/02327* (2013.01); *H01L 31/107* (2013.01)
(58) Field of Classification Search
  CPC ........... H01L 31/1075; H01L 27/14643; H01L 31/02325; H01L 31/02327; H01L 31/107
  (Continued)

(56) References Cited

U.S. PATENT DOCUMENTS

| 4,812,635 A * | 3/1989 | Kaufmann | G01D 5/264 250/205 |
|---|---|---|---|
| 6,649,416 B1 * | 11/2003 | Kauer | G01N 21/6428 422/82.06 |
| 2007/0102654 A1 * | 5/2007 | Schoo | H01L 27/288 250/576 |
| 2012/0091372 A1 * | 4/2012 | Molnar | H01L 27/14685 250/550 |
| 2012/0132809 A1 * | 5/2012 | Findlay | G01J 1/0209 250/353 |

(Continued)

OTHER PUBLICATIONS

Lee. et al.: "Angle sensitive single photon avalanche diode" AIP Publishing LLC; Applied Physics Letters, vol. 106, No. 3, Jun. 8, 2015, pp. 231105-1-231105-5 (Year: 2015).*

(Continued)

*Primary Examiner* — Ismail A Muse
(74) *Attorney, Agent, or Firm* — MH2 Technology Law Group LLP (57) ABSTRACT

A directional photodetector comprises a photosensitive element and a light selector. The photosensitive element comprises a single-photon avalanche diode, SPAD, or an array of SPADs or SPAD array. The light selector is arranged on or above the photosensitive element, in particular on or above an active surface of the photosensitive element. The light selector is configured to restrict a field of view of the photosensitive element at least for light with a wavelength within a specified wavelength range. The light selector is configured to restrict the field of view by predominantly passing light with a direction of incidence within a range of passing directions of the light selector.

11 Claims, 5 Drawing Sheets

(58) Field of Classification Search
USPC .......................................................... 356/4.01
See application file for complete search history.

(56) References Cited

U.S. PATENT DOCUMENTS

| | | | |
|---|---|---|---|
| 2012/0187849 A1* | 7/2012 | Hikmet | G01J 3/0289 |
| | | | 315/152 |
| 2014/0061447 A1* | 3/2014 | Campbell | G01S 17/04 |
| | | | 250/221 |
| 2014/0125990 A1 | 5/2014 | Hinderling et al. | |
| 2015/0090909 A1* | 4/2015 | Shih | H01L 27/288 |
| | | | 250/576 |
| 2017/0038459 A1* | 2/2017 | Kubacki | G01J 1/0425 |
| 2017/0250169 A1* | 8/2017 | Mehrl | H01L 31/02327 |
| 2017/0309665 A1* | 10/2017 | Siegert | H01L 27/14621 |
| 2018/0006182 A1* | 1/2018 | Renard | G01S 7/4813 |
| 2019/0146069 A1* | 5/2019 | Etschmaier | H01L 31/02327 |

OTHER PUBLICATIONS

Horaud, R. et al.: "An overview of depth cameras and range scanners based on time-offlight technologies" Springer Verlag, Machine Vision and Applications, vol. 27, No. 7, Jun. 16, 2016, pp. 1005-1020 (Year: 2016).*
Datasheet VL6180X "Proximity and ambient light sensing (ALS) module" STMicroelectronics (Year: 2016).*
European Search Report for International Application No. PCT/EP2017/064782 dated May 9, 2017 (Year: 2017).*
Office Action issued in European Application No. 16175249.8, dated Sep. 2, 2020, 6 pages.
Lee. et al.: "Angle sensitive single photon avalanche diode" AIP Publishing LLC; Applied Physics Letters, vol. 106, No. 3, Jun. 8, 2015, pp. 231105-1-231105-5.
Horaud, R. et al.: "An overview of depth cameras and range scanners based on time-offlight technologies" Springer Verlag, Machine Vision and Applications, vol. 27, No. 7, Jun. 16, 2016, pp. 1005-1020.
Datasheet VL6180X "Proximity and ambient light sensing (ALS) module" STMicroelectronics.
European Search Report for International Application No. PCT/EP2017/064782 dated May 9, 2017.
Chinese Office Action dated Oct. 25, 2021, Chinese Application No. 201780037990.8, pp. 1-11 (Including English Translation of Search Report).

* cited by examiner

000
DIRECTIONAL PHOTODETECTOR AND OPTICAL SENSOR ARRANGEMENT

BACKGROUND OF THE INVENTION

The disclosure relates to a directional photo sensor and to an optical sensor arrangement, in particular an optical sensor arrangement for time-of-flight measurement.

Single-photon avalanche diodes, SPADs, may be used as particularly sensitive photodetector devices as they may be triggered by a single photon. For example in optical time-of-flight, TOF, measurement systems or sensor arrangements, detectors based on SPADs may be used for distance measurement.

Saturation of a SPAD may be reached when a significant amount of incident photons hits the SPAD during a recovery period of the SPAD during which the photons may not be detected. Undesired or unnecessary light impinging on the SPAD may drive the SPAD into saturation. Consequently, desired light may not be detected reliably anymore. In particular, a count rate of the SPAD may not be related linearly to the detected light level when the SPAD is in saturation. Furthermore, a signal-to-noise ratio of the photodetector may be reduced and the SPAD may be damaged. The undesired or unnecessary light may for example include optical crosstalk, ambient light or background light, in particular in an optical TOF sensor arrangement.

SUMMARY OF THE INVENTION

The disclosure provides an improved concept for a directional photodetector based on one or more SPADs, wherein saturation due to undesired or unnecessary light is avoided.

According to the improved concept, a light selector is arranged above a SPAD or SPAD array. The light selector passes light with a direction of incidence within a range of passing directions and blocks other light. In this way, a directional photodetector is obtained, wherein photons reaching the photodetector under an unwanted or undesired incoming direction are filtered out.

According to the improved concept, a directional photodetector comprising a photosensitive element and a light selector is provided. The photosensitive element comprises a single-photon avalanche diode, SPAD, or an array of SPADs or SPAD array. The light selector is arranged on or above the photosensitive element, in particular on or above an active surface of the photosensitive element. The light selector is configured to restrict a field of view of the photosensitive element at least for light with a wavelength within a specified wavelength range. The light selector is configured to restrict the field of view by predominantly or exclusively passing light with a direction of incidence within a range of passing directions of the light selector.

Herein, the expression "light" refers to electromagnetic radiation with respect to which the photosensitive element and further photosensitive elements involved is sensitive. For example, "light" may refer to visible light, ultraviolet radiation and/or infrared radiation. In particular, "light" may refer to infrared radiation.

In some implementations, the specified wavelength range corresponds to an emission spectrum of an optical emitter whose light is to be detected by the directional photodetector.

In some implementations, the field of view of the photosensitive element corresponds to a solid angle, a solid angle range or a combination of several solid angle ranges through which the photosensitive element is sensitive to electromagnetic radiation.

The expression "predominantly passing light with a direction of incidence within a range of passing directions" means that light impinging on the light selector from a direction within the range of passing directions is passed and light impinging on the light selector from a direction outside of the range of passing directions is blocked.

The passing of light may involve an attenuation of light. The blocking of light may involve for a complete blocking or suppression of the light or may involve a strong attenuation of light. In particular, the attenuation of light for the case of light blocking is stronger, in particular significantly stronger, than for the case of light passing.

In some implementations, the range of passing directions of the light selector corresponds to a range of incident directions for light. Therein, for example light impinging on the light selector from a direction within the range of passing directions is passed and light impinging on the light selector from a direction outside of the range of passing directions is blocked. This holds at least for light within the specified wavelength range.

In some implementations, the range of incident directions defining the range of passing directions of the light selector corresponds to a specified range or several specified ranges of incident angles, measured for example with respect to a normal direction to the active surface of the photosensitive element. The specified range of incident angles may be constant for all incident planes or may vary for different incident planes.

In some implementations, the specified range of incident angles may be constant for a set of incident planes being parallel to each other.

In some implementations, the range of incident directions defining the range of passing directions corresponds to a combination of a specified range of incident angles and a specified range of azimuth angles, measured for example with respect to the normal direction to the active surface of the photosensitive element. In some implementations, the range of incident directions corresponds to a specified range of incident angles for each fixed azimuth angle.

According to some implementations of the directional photodetector, the photosensitive element and/or the light selector is integrated in a semiconductor die and/or an integrated circuit IC. The photosensitive element and/or the light selector are for example manufactured by means of standard semiconductor processing.

Due to the restriction of the field of view of the photosensitive element my means of the light selector, only a fraction of light defined by the range of passing directions may reach the photosensitive element. Consequently, a saturation of the SPAD or SPAD array by undesired or unwanted light may be avoided or a risk for the saturation may be reduced. Therein, the undesired or unwanted light corresponds to light impinging on the photosensitive element with an incident direction outside the range of passing directions.

According to some implementations of the directional photodetector, the light selector comprises an interference filter, in particular an optical interference filter, with a passband, in particular a spectral passband. A spectral position of the passband depends on an angle of incidence of light impinging on the interference filter. The spectral position of the passband is given by to a position of a wavelength range corresponding to the passband.

The interference filter, in particular the passband, is adapted such that light of the specified spectrum and with an incident direction lying within the range of passing directions is passed.

According to some implementations of the directional photodetector, the interference filter has a maximum transmission value for light with a principal wavelength of the interference filter for orthogonal incidence. Therein, orthogonal incidence corresponds to incidence with a zero incident angle measured from a direction normal to a surface of the interference filter. The surface of the interference filter is parallel to the active surface of the photosensitive element.

The range of passing directions of the light selector is at least partially defined by a shift between the principle wavelength and a characteristic wavelength of the specified wavelength range.

The principal wavelength of the interference filter lies within the passband for orthogonal incidence, in particular corresponds to a center wavelength, a peak wavelength or a mean wavelength of the passband for orthogonal incidence.

The characteristic wavelength of the specified wavelength range corresponds to a center wavelength, a peak wavelength or a mean wavelength of the specified wavelength range, in particular of the emission spectrum.

In some implementations, the shift between the principle wavelength and the characteristic wavelength is zero. In such implementations, the interference filter has the maximum transmission value for light with the characteristic wavelength at orthogonal incidence, in particular for zero incident angle measured with respect to the normal to the active surface of the photosensitive element.

In some implementations, the shift between the principle wavelength and the characteristic wavelength is nonzero. In such implementations, the interference filter has the maximum transmission value for light with the characteristic wavelength for a nonzero incident angle measured with respect to the normal to the active surface of the photosensitive element. Consequently, the maximum transmission value for light with the characteristic wavelength is given for flatter incidence compared to orthogonal incidence.

Consequently, by adapting the interference filter, in particular the spectral position of the passband, the range of passing directions of the light selector may be adapted or tuned, in particular for light within the specified wavelength range.

According to some implementations of the directional photodetector, the light selector comprises a stack of metal layers forming one or more channels through which light can pass, in particular can pass the stack of metal layers and/or can pass the light selector at least partially.

In some implementations, the stack of metal layers comprises two or more metal layers embedded in an insulator material, in particular an electrically insulating material, for example an oxide, in particular silicon dioxide.

The metal layers and the insulator material may for example be manufactured by means of standard semiconductor processing, for example by means of CMOS processes. In particular, no dedicated or specifically adapted processes may be required to generate the metal layers or the insulator material.

According to some implementations of the directional photodetector, each of the metal layers of the stack of metal layers comprises metal structures.

According to some implementations, to form the one or more channels, the metal structures of subsequent layers of the metal layers are arranged on top of each other, in particular congruently top of each other.

Consequently, at least for one fixed azimuth angle or at least for a fixed incident plane and incident planes parallel to the fixed incident plane, the range of passing directions is defined by a range of incident angles around zero incident angle, in particular around orthogonal incidence.

According to some implementations of the directional photodetector, the metal structures of subsequent layers of the metal layers are laterally shifted with respect to each other to form the one or more channels.

In particular, the metal structures of the subsequent layers may be gradually shifted. For example, a shift of the metal structures with respect to a lowest layer of the metal layers may increase for each higher lying layer with increasing vertical distance from the lowest layer.

Consequently, at least for one fixed azimuth angle or at least for a fixed incident plane and incident planes parallel to the fixed incident plane, the range of passing directions is defined by a range of incident angles around a nonzero incident angle. The range of passing directions may be further defined for example by a distance of the metal structures within the individual metal layers, by the number of metal layers comprised by the stack of metal layers and/or by a distance, in particular vertical distance, of the metal layers with respect to each other.

The distance of the metal layers with respect to each other may be constant for all metal layers or may be different for different pairs of metal layers.

Depending on the distances between the metal structures and the distances between the metal layers, wave optical effects such as diffraction or interference may become relevant.

In some implementations, the metal structures comprise parallel strips, wherein an orientation of the strips is equal in each of the metal layers.

In some implementations, the metal structures comprise parallel strips, wherein an orientation of the strips of at least two different metal layers are rotated with respect to each other. In such implementations, the range of passing directions may be restricted to a range around orthogonal incidence for all incident planes and/or azimuth angles.

In some implementations, the metal structures may comprise rotationally or axially symmetric structures, for example regular polygons such as squares, rectangles, hexagons, octagons and so forth or circular or elliptical structures.

According to the improved concept, also an optical sensor arrangement for time-of-flight, TOF, measurement is provided. The sensor arrangement comprises an optical emitter and a measurement photodetector implemented as a directional photodetector according to the improved concept. The measurement photodetector is arranged and configured to detect light entering the sensor arrangement through a measurement aperture in a housing of the sensor arrangement. The specified wavelength range corresponds to an emission spectrum of the emitter. In particular, the characteristic wavelength of the specified wavelength range corresponds to a center wavelength, peak wavelength or mean wavelength of the emission spectrum.

Due to the implementation of the measurement photodetector as a directional photodetector according to the improved concept, detection of unwanted or undesired light by the measurement photodetector, in particular due to optical crosstalk between the emitter and the measurement photodetector, may be avoided or reduced. Thus, a measurement accuracy of the sensor arrangement may be improved and/or a saturation of the SPAD or SPAD array of the measurement photodetector may be avoided.

According to some implementations, the sensor arrangement further comprises a control unit. The measurement photodetector is configured to generate a measurement signal in response to light detected by the measurement photodetector. The control unit is configured to compute a TOF depending on the measurement signal. In particular, the control unit is configured to compute a stop time for the TOF measurement depending on the measurement signal and to compute the TOF depending on the stop time. In particular, the TOF corresponds to a TOF of light emitted by the emitter, reflected at least partially by an external object whose distance to the sensor arrangement is to be measured, and subsequently reaching the sensor arrangement again, in particular the measurement photodetector.

The TOF is for example computed as a difference between the stop time and a start time for the TOF measurement. The start time may for example be determined by a time at which the emitter begins to emit light or a light pulse for the TOF measurement. The start time may be determined by calibration or estimated. Alternatively, the start time may be computed by the control unit based on a reference signal generated for example by an optional reference photodetector of the sensor arrangement.

According to some implementations of the sensor arrangement, the range of passing directions of light selector of the measurement photodetector includes an orthogonal direction with respect to an active surface of the measurement photodetector, for example of the photosensitive element, in particular the SPAD or SPAD array, of the measurement photodetector.

In some implementations, the range of passing directions of the measurement photodetector further includes a range, for example a solid angle range, around the orthogonal direction.

In some implementations, the range of passing directions of the measurement photodetector does not include an incident direction of light corresponding to crosstalk from the optical emitter or such incident direction is excluded from the range of passing directions.

Light entering the sensor arrangement through the measurement aperture may impinge under orthogonal incidence or predominantly under orthogonal incidence on the measurement photodetector. The light entering through the measurement aperture includes desired light to be measured by the measurement photodetector for the TOF measurement, in particular light being emitted by the emitter and reflected by the external object.

On the other hand, optical crosstalk from the emitter may for example impinge or impinge predominantly under a flatter incidence compared to orthogonal incidence or under a nonzero incident angle on the measurement photodetector. Consequently, the desired light may pass the light selector of the measurement photodetector, while undesired light such as crosstalk may be blocked or partially blocked by the light selector of the measurement photodetector. In this way, a measurement accuracy of the sensor arrangement, in particular of the measurement photodetector and the stop time, may be improved. A saturation of the measurement photodetector may be avoided.

According to some implementations of the sensor arrangement, the light selector of the measurement photodetector comprises an interference filter with a passband, wherein a spectral position of the passband depends on an angle of incidence. For orthogonal incidence, the interference filter of the measurement photodetector has a maximum transmission value for light with a principal wavelength. The range of passing directions of the light selector of the measurement photodetector is at least partially defined by a shift between the principal wavelength of the interference filter of the measurement photodetector and a characteristic wavelength of the emission spectrum. The principle wavelength of the interference filter of the measurement photodetector matches the characteristic wavelength of the emission spectrum.

Consequently, light with a wavelength corresponding to the characteristic wavelength or lying within the emission spectrum is passed under orthogonal incidence and may be blocked under flat incidence.

According to some implementations of the sensor arrangement, the light selector of the measurement photodetector comprises a stack of metal layers forming one or more channels through which light can pass. Each of the metal layers of the measurement photodetector comprises metal structures and, to form the one or more channels, the metal structures of subsequent layers of the metal layers of the measurement photodetector are arranged on top of each other.

According to some implementations of the sensor arrangement, the optical emitter is configured to emit light within the emission spectrum through an emission aperture in the housing of the sensor arrangement.

According to some implementations, the sensor arrangement further comprises a reference photodetector implemented as a directional photodetector according to the improved concept. The reference photodetector is arranged and configured to detect light emitted by the emitter and reflected, in particular internally reflected, by the housing. The specified wavelength range of the reference photodetector corresponds for example to the emission spectrum of the emitter.

According to some implementations of the sensor arrangement, the reference photodetector is configured to generate a reference signal in response to light detected by the reference photodetector. In implementations comprising the control unit, the control unit is configured to compute the TOF depending on the measurement signal and on the reference signal. In particular, the control unit is configured to compute a start time for the TOF measurement depending on the reference signal, the stop time for the TOF measurement depending on the measurement signal, and the TOF depending on the start and the stop time.

Due to the implementation of the reference photodetector as a directional photodetector according to the improved concept, detection of unwanted or undesired light by the reference photodetector, in particular due to ambient light or background light entering the sensor arrangement for example through the emission aperture, may be avoided or reduced. Thus, a measurement accuracy of the sensor arrangement may be further improved and/or a saturation of the SPAD or SPAD array of the reference photodetector may be avoided.

According to some implementations of the sensor arrangement, the range of passing directions of the light selector of the reference photodetector does not include an orthogonal direction with respect to an active surface of the reference photodetector, for example of the photosensitive element, in particular the SPAD or SPAD array, of the reference photodetector. In particular, the orthogonal direction with respect to the active surface of the reference photodetector is excluded from the range of passing directions of the reference photodetector. For example, a range of incident directions around the orthogonal direction with respect to the active surface of the reference photodetector may be excluded from the range of passing directions of the reference photodetector.

In some implementations, the range of passing directions of the reference photodetector does include an incident direction of light corresponding to crosstalk from the optical emitter or of light emitted by the emitter and being internally reflected from the housing.

Light being emitted by the emitter, reflected, in particular internally, by the housing and reaching the reference photodetector may impinge on the reference photodetector under various incident angles. The light emitted by the emitter and reflected by the housing includes desired light to be measured by the reference photodetector for the TOF measurement. Also ambient light may impinge on the reference photodetector under various incident angles. Thus, by excluding certain incident directions of light, in particular restricting the field of view of the reference photodetector, a saturation of the reference photodetector may be avoided.

According to some implementations of the sensor arrangement, the range of passing directions of the light selector of the reference photodetector does not include one or more directions towards the emission aperture of the housing. In particular, the one or more directions towards the emission aperture may be given by one or more lines of sight between an active surface of the photosensitive element of the reference photodetector and the emission aperture.

Consequently, background or ambient light entering the sensor arrangement through the emission aperture and being detected by the reference photodetector may be reduced or avoided. Thus, a saturation of the reference photodetector may be avoided and/or a measurement accuracy of the reference photodetector may be improved.

According to some implementations of the sensor arrangement, the light selector of the reference photodetector comprises an interference filter with a passband, wherein a spectral position of the passband depends on an angle of incidence. For orthogonal incidence, the interference filter of the reference photodetector has a maximum transmission value for light with a principal wavelength. The range of passing directions of the light selector of the reference photodetector is at least partially defined by a shift between the principal wavelength of the interference filter of the reference photodetector and the characteristic wavelength of the emission spectrum. The principle wavelength of the interference filter of the reference photodetector is shifted with respect to the characteristic wavelength of the emission spectrum, in particular lies outside of the emission spectrum.

Consequently, light with a wavelength corresponding to the characteristic wavelength or lying within the emission spectrum is passed under incidence with a nonzero incidence angle defined by the shift between principle wavelength of the reference photodetector and characteristic wavelength of the emission spectrum.

According to some implementations of the sensor arrangement, the light selector of the reference photodetector comprises a stack of metal layers forming one or more channels through which light can pass. Each of the metal layers of the reference photodetector comprises metal structures and, to form the one or more channels, the metal structures of subsequent layers of the metal layers of the reference photodetector are laterally shifted with respect to each other.

According to some implementations of the sensor arrangement, the one or more channels formed by the stack of metal layers of the reference photodetector are directed at least partially towards the optical emitter.

According to some implementations of the sensor arrangement comprising the reference photodetector and wherein the reference photodetector is implemented as a directional photodetector according to the improved concept, the measurement photodetector is not implemented as a directional photodetector according to the improved concept.

According to some implementations of the sensor arrangement, the housing comprises an optical barrier separating an interior of the housing into a first cavity and a second cavity.

The reference photodetector and the emitter are arranged in the first cavity and the measurement photodetector is arranged in the second cavity.

Consequently, by means of the optical barrier, optical crosstalk between the emitter and the measurement photodetector may be further reduced.

According to some implementations of the sensor arrangement, the reference photodetector and the measurement photodetector are implemented on a single semiconductor die, in particular are integrated in a single integrated circuit. According to some implementations the control unit is implemented on the same semiconductor die or integrated circuit as the photo detectors.

BRIEF DESCRIPTION OF THE DRAWINGS

In the following, the disclosure is explained in detail with the aid of exemplary implementations by reference to the drawings. Components that are functionally identical or have an identical effect may be denoted by identical references. Identical components and/or components with identical effects may be described only with respect to the figure where they occur first and their description is not necessarily repeated in subsequent figures. All features and details of specific implementations may be combined with other implementations if not stated otherwise. In the drawings.

DETAILED DESCRIPTION

Figure 1:
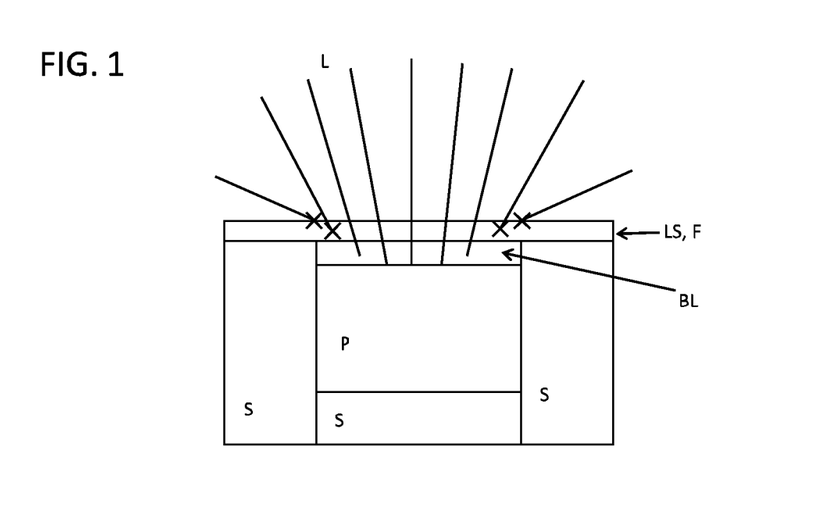
FIG. 1 shows schematically an exemplary implementation of a directional photodetector according to the improved concept.

FIG. 1 shows schematically an exemplary implementation of a photodetector according to the improved concept. The directional photodetector comprises a semiconductor body S, for example a semiconductor substrate, and a photosensitive element P embedded in the semiconductor body S. The semiconductor body and the photosensitive element P may for example be part of a semiconductor die.

The photosensitive element P comprises a SPAD or a SPAD array. Furthermore, the photodetector comprises a light selector LS. In the example of FIG. 1, the light selector LS comprises an interference filter F implemented as a band-pass filter with a passband having an angular dependent spectral position. The interference filter F is arranged on a top surface of the semiconductor die or semiconductor body S and is in particular arranged above or on an active surface of the photosensitive element P. A range of passing directions of the light selector LS is determined by the interference filter F.

Optionally, the photodetector comprises one or more backend layers BL arranged between the photosensitive element P and the interference filter F. The backend layers BL may for example comprise insulator layers such as oxide layers.

Figure 2:
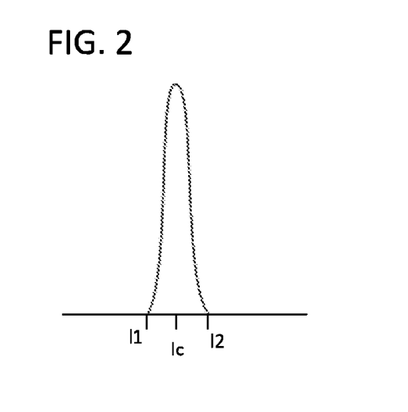
FIG. 2 shows schematically an emission spectrum of a laser diode.

FIG. 2 shows schematically an emission spectrum of an optical emitter, for example a laser diode, in particular a VCSEL or VECSEL.

The emission spectrum may have a maximum at a characteristic wavelength lc, which may for example lie in the infrared spectrum of electromagnetic radiation. For example, the characteristic wavelength lc may be 940 nm. The emission spectrum drops to zero or essentially to zero at a lower wavelength l1 and an upper wavelength l2 limiting the emission spectrum. A linewidth of the emission spectrum given by a difference between the lower and the upper wavelength l1, l2 may lie in the order of few nanometers. For example for a characteristic wavelength lc of 940 nm, the lower and the upper wavelength l1,l2 may be approximately 938 nm and 942 nm, respectively.

Figure 3:
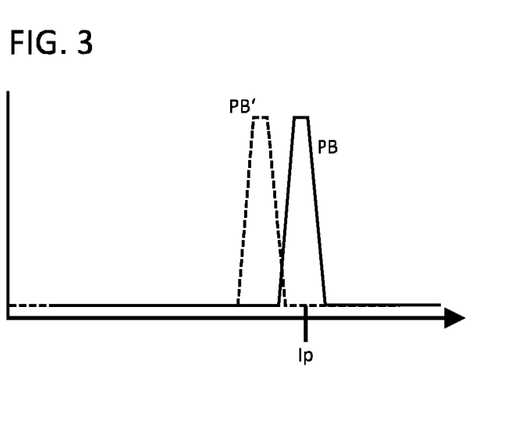
FIG. 3 shows schematically the transmission of an interference filter to be used in an exemplary implementation of a directional photodetector according to the improved concept as a function of wavelength.

FIG. 3 shows schematically the transmission of an interference filter F to be used in an exemplary implementation of a directional photodetector according to the improved concept as a function of wavelength. The interference filter F of FIG. 1 may for example have a transmission as schematically shown in FIG. 3.

A solid line in FIG. 3 shows schematically the transmission of the interference filter F at orthogonal incidence that is for zero incidence angle measured from a normal to a main surface of the interference filter F. The transmission has a passband for orthogonal incidence PB, which is for example centered or approximately centered or has a peak at a principal wavelength lp. The transmission has for example a maximum transmission value for light with a wavelength corresponding to the principal wavelength lp for orthogonal incidence. The maximum transmission value may for example correspond to less than 100% transmission, for example to a value between 70% and 100% transmission, for example to a value of 80% or approximately 80% transmission.

A dashed line in FIG. 3 shows schematically the transmission of the interference filter F for a nonzero incidence angle, for example for an incidence angle of 30° measured from the normal to the main surface of the interference filter F. The transmission has a passband for the nonzero incidence angle PB'. The passband for the nonzero incidence angle PB' corresponds for example to the passband for orthogonal incidence PB shifted towards smaller wavelengths. This may be a consequence of a composition of the interference filter F comprising an alternating stack of electrically insulating layers with different indices of refraction.

Figure 4:
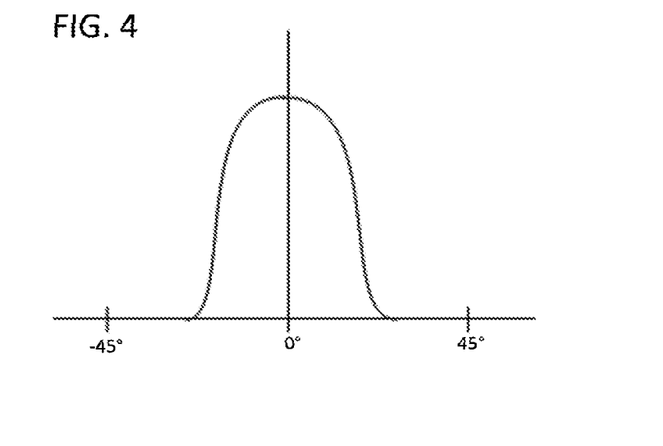
FIG. 4 shows schematically the transmission of an interference filter to be used in an exemplary implementation of a directional photodetector according to the improved concept as a function of an incident angle.

In the implementation shown in FIG. 1, the principal wavelength lp for orthogonal incidence of the interference filter F matches for example the characteristic wavelength lc of the emission spectrum as shown for example in FIG. 2. A resulting transmission curve of the interference Filter F as a function of the incidence angle for light with a wavelength corresponding to the characteristic wavelength lc is shown in FIG. 4.

In agreement with the passband for orthogonal incidence PB of FIG. 3, the transmission of the interference filter has the maximum value for zero incidence angle. For increasing incident angles, the transmission value drops due to the shift of the passband as described in FIG. 3. Thus, at larger incidence angles, for example at an incidence angle of ±45°, the transmission for light with a wavelength corresponding to the characteristic wavelength lc may be zero or approximately zero.

Consequently, for light L with a wavelength within the emission spectrum, in particular a wavelength corresponding to the characteristic wavelength lc, the light selector LS of the photodetector of FIG. 1 passes predominantly light with zero or small incident angles and blocks light with large incident angles. The blocking of the light L is depicted in FIG. 1 schematically by crosses.

Figure 5:
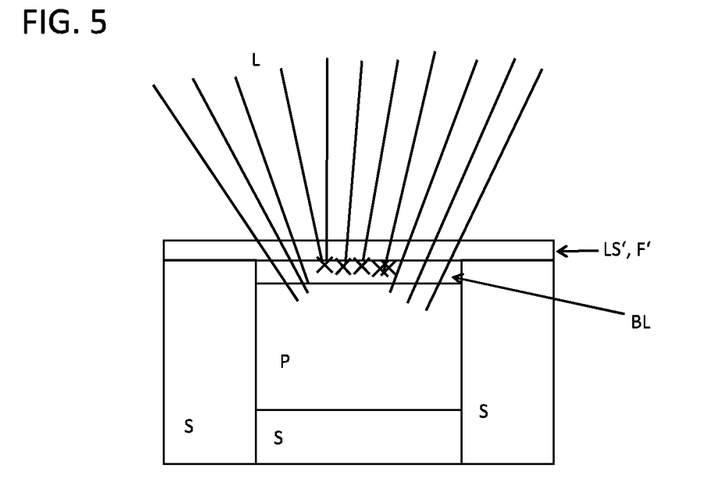
FIG. 5 shows schematically a further exemplary implementation of a directional photodetector according to the improved concept.

FIG. 5 shows schematically a further exemplary implementation of a directional photodetector according to the improved concept. The photodetector of FIG. 5 is based on the photodetector of FIG. 1.

The interference filter F of FIG. 5 may for example have a transmission as schematically shown in FIG. 3. However, the light selector LS', in particular the interference filter F', of the photodetector of FIG. 5 differs from the interference filter F of the photodetector of FIG. 1. In particular, the principal wavelength lp for orthogonal incidence is shifted with respect to the characteristic wavelength lc. For example, for a characteristic wavelength lc of 940 nm, the principal wavelength lp for orthogonal incidence of the interference filter F' may be 960 nm.

Consequently, as indicated by the shift of the passbands PB, PB' in FIG. 3, the transmission value of the interference filter F' for light with a wavelength corresponding to the characteristic wavelength lc has the maximum value for incidence under a nonzero incidence angle, for example an incidence angle of ±45°.

Figure 6:
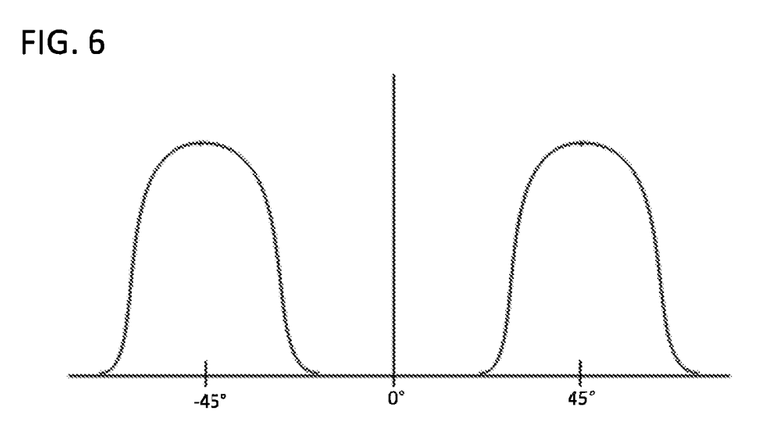
FIG. 6 shows schematically the transmission of an interference filter to be used in a further exemplary implementation of a directional photodetector according to the improved concept as a function of an incident angle.

A resulting transmission curve of the interference Filter F' as a function of the incidence angle for light with a wavelength corresponding to the characteristic wavelength lc is shown in FIG. 6.

In agreement with the passband for orthogonal incidence PB of FIG. 3, the transmission of the interference filter F' is reduced or zero for zero incidence angle. On the other hand, for a nonzero incidence angle, for example an incidence angle of ±45°, the transmission of the interference filter F' has the maximum transmission value.

Consequently, for light L with a wavelength within the emission spectrum, in particular a wavelength corresponding to the characteristic wavelength lc, the light selector LS' of the photodetector of FIG. 1 passes predominantly light with a nonzero incidence angle, for example at or around ±45°, and blocks light with zero incidence angle.

As readily recognized by the skilled reader, the incident angles under which the transmission of the interference filter F' becomes maximum for light with the characteristic wavelength lc may be tuned or adapted by adapting the interference filter F'. In particular, the shift between the principal wavelength lp and the characteristic wavelength lc defines said incident angles.

Figure 7:
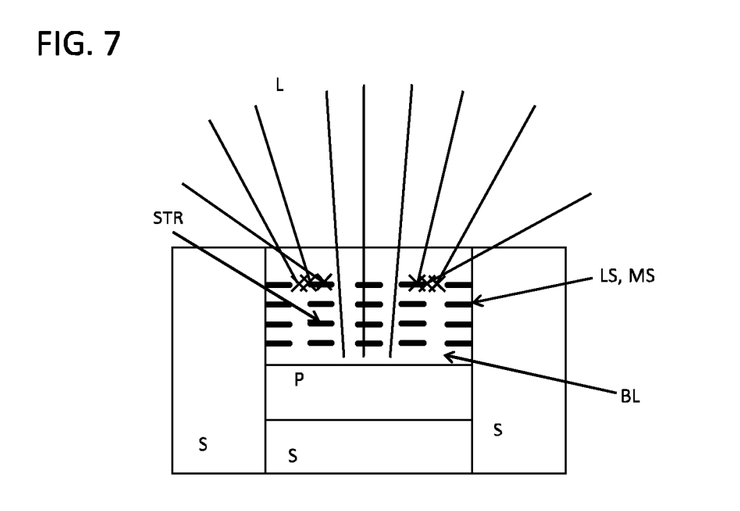
FIG. 7 shows schematically a further exemplary implementation of a directional photodetector according to the improved concept.

FIG. 7 shows schematically a further exemplary implementation of a photodetector according to the improved concept. The photodetector of FIG. 7 is based on the photodetector of FIG. 1.

Figure 8:
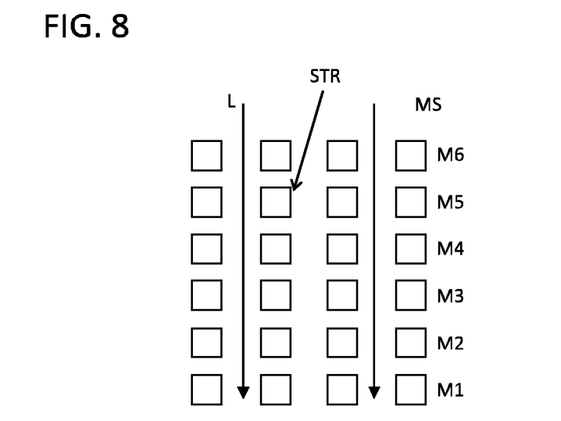
FIG. 8 shows schematically a stack of metal layers of a further exemplary implementation of a directional photodetector according to the improved concept.

The light selector LS of the photodetector of FIG. 7 may for example not comprise an interference filter but a stack of metal layers MS. The stack of metal layers MS comprises several metal layers M1, . . . , M6 stacked onto each other as depicted schematically also in FIG. 8. It is pointed put that the number of metal layers comprised by the stack MS is not limited to the four or six metal layers M1, . . . , M6 as shown in FIGS. 7 and 8 as examples.

The stack of metal layers MS is for example comprised by or embedded in the backend layers BL. In particular, the metal layers M1, . . . , M6 may be embedded in the insulator layers of the backend layers BL. The metal layers M1, . . . , M6 may for example correspond to metallization layers according to a semiconductor manufacturing process, in particular a standard semiconductor process, for example a CMOS process.

Each of the metal layers M1, . . . , M6 comprises metal structures STR, wherein the metal structures STR of two subsequent metal layers M1, . . . , M6 are arranged on top of other, in particular congruently on top of each other. The metal structures STR may for example be implemented as strips, wherein the strips of a given metal layer are oriented parallel to each other. Thereby, channels between the metal structures STR are formed, the channels being orthogonal to a stacking direction of the metal layers M1, . . . , M6.

Due to the stack of metal layers, incoming light L impinging on the light selector LS may be partially blocked and partially passed. In particular, light hitting the metal structures STR may be reflected and/or absorbed by the metal structures STR and consequently blocked.

On the other hand, at least a fraction of light with an incoming direction corresponding to an orientation of the channels may pass through the channels and reach the photosensitive element P. In particular, this may be the case for light with an incident angle being zero or close to zero in with respect to an incident plane orthogonal to the orientation of the strips of the metal structures STR.

In implementations where the respective metal structures of all metal layers M1, . . . , M6 are implemented as strips arranged congruently on top of each other, the channels may pass light irrespective of its incident angle with respect to an incident plane parallel to the orientation of the strips of the metal structures STR.

In alternative implementations, the metal structures STR, in particular the strips, of at least one of the metal layers M1, . . . , M6 are rotated with respect to the metal structures STR, in particular the strips, of at least one further of the metal layers M1, . . . , M6. Consequently, the channels may pass light with an incident angle being zero or close to zero with respect to an incident plane orthogonal to the orientation of the strips of the metal structures STR and with respect to an incident plane parallel to the orientation of the strips of the metal structures STR and block other light.

In alternative implementations, the metal structures comprise rotationally or axially symmetric structures, for example regular polygons such as squares, rectangles, hexagons, octagons and so forth or circular or elliptical structures.

The geometry of the metal structures STR, a lateral distance or lateral distances between metal structures of a given metal layer M1, . . . , M6 and/or a distance, in particular vertical distance, between the metal layers M1, . . . , M6 define the range of incident directions of the light selector LS.

It is further pointed out that the distances between the metal structures STR of a given metal layer M1, . . . , M6 are not necessarily equal as they are in the example of FIGS. 7 and 8. Also the distances between subsequent metal layers M1, . . . , M6 are not necessarily equal for all metal layers M1, . . . , M6 as they are in the example of FIGS. 7 and 8. For example, the distances between the metal layers M1, . . . , M6 may be predetermined by the semiconductor or CMOS manufacturing process.

Figure 9:
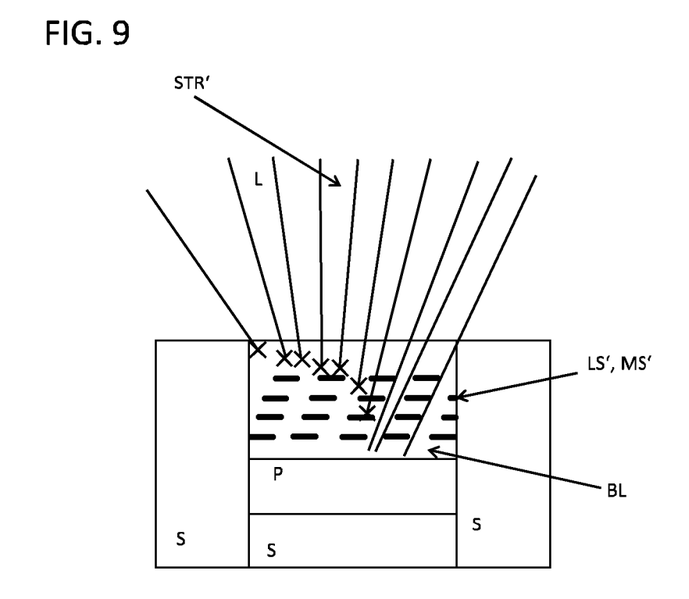
FIG. 9 shows schematically a further exemplary implementation of a directional photodetector according to the improved concept.
Figure 10:
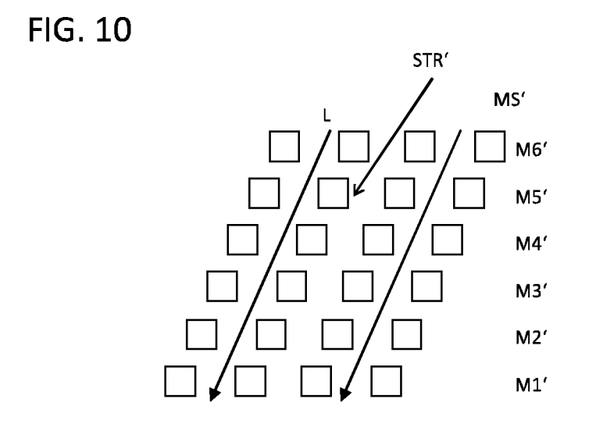
FIG. 10 shows schematically a stack of metal layers of a further exemplary implementation of a directional photodetector according to the improved concept.

FIG. 9 shows schematically a further exemplary implementation of a photodetector according to the improved concept. FIG. 10 shows schematically a corresponding stack of metal layers MS'. The photodetector of FIG. 9 is based on the photodetector of FIG. 7.

In the light selector LS' of the photodetector of FIG. 9, the metal structures STR' of subsequent metal layers M1, . . . , M6' are not are arranged on top of each other as in the implementation of FIG. 7 but are laterally shifted with respect to each other. In particular, the metal structures STR' of the metal layers M1, . . . , M6' are laterally gradually shifted with respect to a lowest layer M1' of the metal layers M1, . . . , M6', the lowest layer M1' being arranged closest to the photosensitive element P. Therein, being "laterally gradually shifted" means for example that a lateral shift of the metal structures STR' of one of the metal layers M2', . . . , M6' with respect to the metal structures STR' of the lowest metal layer M1' is greater the greater the vertical distance between said one of the metal layers M2', . . . , M6' is with respect to the lowest metal layer M1'.

A direction of the shift defines an orientation of the channels. The orientation of the channels in turn define the range of passing directions of the light selector LS'.

In the non-limiting example of FIGS. 9 and 10, the metal structures STR' are for example implemented as strips. The strips are for example laterally shifted in a direction perpendicular to the orientation of the strips. Consequently, the resulting channels may pass light with incident directions corresponding to a nonzero incident angle with respect to an incident plane orthogonal to the orientation of the strips of the metal structures STR'.

The nonzero angle may for example lie between 15° and 90° measured from the normal with respect to the active surface of the photosensitive element P. In particular, the nonzero angle may lie between 20° and 60°, for example between 20° and 30°. However, obviously any nonzero angle may be achieved by adapting the lateral shift between the metal structures STR' of subsequent metal layers M1', . . . , M6'.

Figure 11:
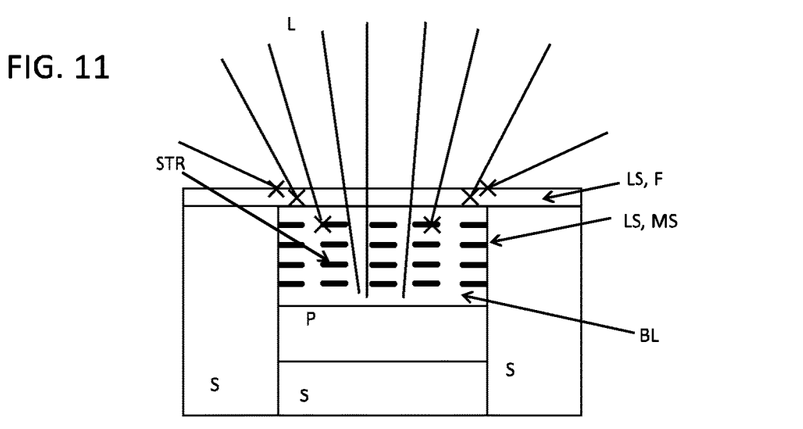
FIG. 11 shows schematically a further exemplary implementation of a directional photodetector according to the improved concept.

FIG. 11 shows schematically a further exemplary implementation of a photodetector according to the improved concept based on the implementations described with respect to FIG. 1.

The photodetector of FIG. 11 further comprises, for example embedded in the backend layers BL, a stack of metal layers MS as described with respect to FIGS. 7 and 8.

It is pointed out that the order of the stack of metal layers MS and the interference filter F may also be reversed in some implementations such that the interference filter F is arranged between the stack of metal layers MS and the photosensitive element P.

Figure 12:
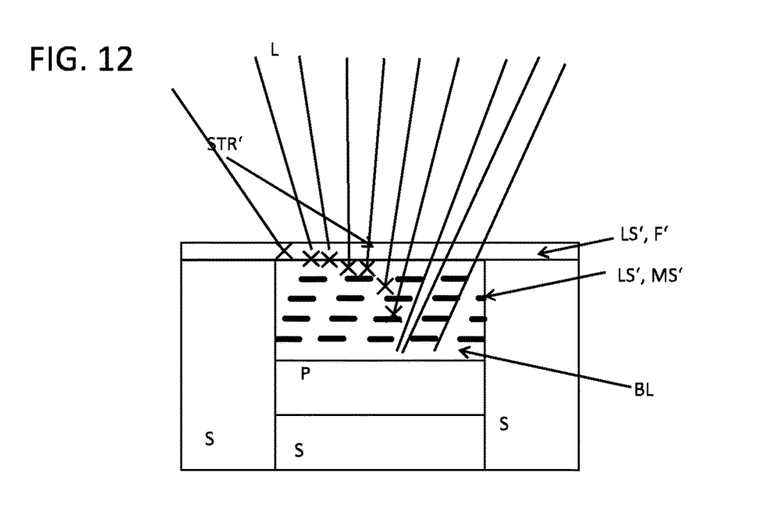
FIG. 12 shows schematically a further exemplary implementation of a directional photodetector according to the improved concept.

FIG. 12 shows schematically a further exemplary implementation of a photodetector according to the improved concept based on the implementations described with respect to FIG. 5.

The photodetector of FIG. 12 further comprises, for example embedded in the backend layers BL, a stack of metal layers MS' as described with respect to FIGS. 9 and 10.

The stack of metal layers MS' and the interference filter F' are adapted with respect to each other. In particular, light with a wavelength within the specified spectral range, in particular light having the characteristic wavelength lc, being able to pass the channels formed by the metal layers M1', . . . , M6' is at least partially passed by the interference filter F'.

Due to the combination of the respective interference filter F, F' and the respective stack of metal layers MS, MS', the restriction of the field of view, in particular the definition of the range of passing directions, of the photodetector may be further improved in implementations as in FIGS. 11 and 12. In particular, the field of view may be defined in a more accurate and/or a more flexible way as recognized by the skilled reader from the explanations above. Furthermore, a more effective or more strict separation of incoming directions being passed and incoming directions being blocked by the light selector LS may be achieved.

Figure 13:
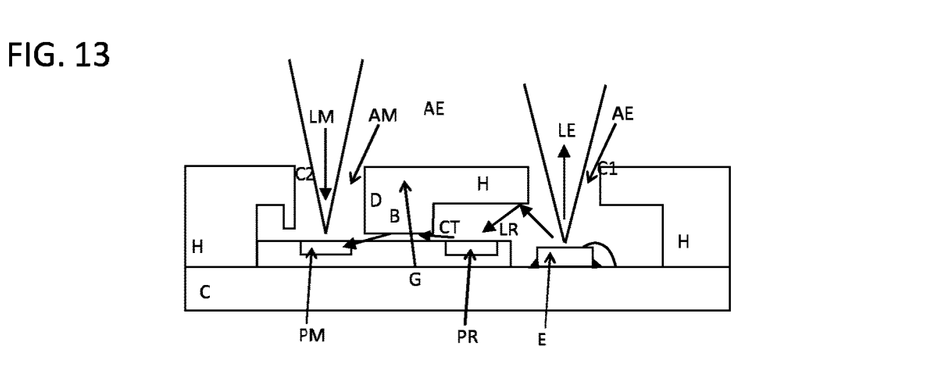
FIG. 13 shows schematically an exemplary implementation of an optical sensor arrangement according to the improved concept.

FIG. 13 shows schematically an exemplary implementation of an optical sensor arrangement for time-of-flight, TOF measurement, according to the improved concept.

The sensor arrangement comprises a carrier C and a housing H. The housing H may be mounted on the carrier C. Alternatively, the housing H and the carrier C may be comprised by a single piece of material.

The sensor arrangement further comprises an optical emitter E, for example a VCSEL, in particular an infrared emitter, arranged and mounted on the carrier C. The optical emitter E is configured to emit light LE, in particular in a pulsed manner, according to an emission spectrum, for example an emission spectrum as in FIG. 2, through an emission aperture AE of the housing H arranged above the emitter E.

The sensor arrangement comprises a reference photodetector PR and a measurement photodetector PM arranged on the carrier C. The reference photodetector PR is optional. If applicable, the reference photodetector PR may be arranged closer to the emitter E than the measurement photodetector PM. In some implementations, the photodetector PM and the reference photodetector PR are comprised by a detector die D mounted on the carrier C.

The sensor arrangement, comprises an optical barrier B separating an interior of the sensor arrangement into a first cavity C1 and a second cavity C2. The optical barrier may be comprised by or attached to the housing H. The emitter E and the reference photodetector PR are arranged in the first cavity C1 and the measurement photodetector PM is arranged in the second cavity C2.

Optionally, the interior of the sensor arrangement may be filled with a casting material, for example comprising an epoxy and/or silicone material.

The optical barrier B may be attached or directly attached to the detector die D. In such implementations, there may be no gap G between the optical barrier B and the detector die D. In other implementations, the optical barrier B may be not directly attached to the detector die D and/or there may be a gap G between the optical barrier B and the detector die D. Alternatively, in particular if the photodetector PM and the reference photodetector PR are not comprised by a single detector die D, there may be a gap G between the optical barrier B and the carrier C.

The housing H has a measurement aperture AM arranged above the measurement photodetector PM through which light to be measured LM may enter the sensor arrangement and hit the measurement photodetector PM.

The measurement photodetector PM may be implemented as a directional photodetector according to the improved concept, in particular as described with respect to one of FIG. 1, 7 or 11.

The range of passing directions of the measurement photodetector PM includes incoming directions corresponding to the light LM entering through the measurement aperture AM, in particular includes directions orthogonal to the active surface of the photosensitive element P of the measurement photodetector PM.

In operation, the emitter E may emit the light LE within the emission spectrum. The emitted light LE may be at least partially reflected by an external object (not shown) whose distance with respect to the sensor arrangement is to be determined. The partially reflected light may enter the sensor arrangement as the light to be measured LM.

Since the light LM entering through the measurement aperture AM may hit the measurement photodetector PM predominantly under orthogonal incidence or under a relatively small incident angle, it may be passed by the light selector LS of the measurement photodetector PM and detected by the photosensitive element P of the measurement photodetector PM.

The measurement photodetector PM may generate a measurement signal based on the detected light. A control unit (not shown) of the sensor arrangement, which may for example be comprised by the detector die D, computes a stop time for the TOF measurement depending on the measurement signal. The control unit further computes the TOF depending on the stop time. A distance between the external object and the sensor arrangement may then be determined depending on the TOF, in particular may be directly proportional to the TOF.

Furthermore, light corresponding to optical crosstalk light CT may reach the measurement photodetector PM. The crosstalk light CT may for example be emitted by the emitter E and leak from the first cavity C1 to the second cavity C2 through the gap G.

Alternatively or in addition, the crosstalk light CT may reach the second cavity C2 via a cover (not shown), in particular an optically transparent or translucent cover, covering the housing H, the apertures AE, AM and/or the sensor arrangement. In particular, the crosstalk light CT may be emitted by the emitter E, reflected from and/or within the cover and thereby reach the second cavity C2.

The crosstalk light CT or at least parts of the crosstalk light CT may hit the light selector LS of the measurement photodetector PM under an incident direction outside of the range of passing directions of the measurement photodetector PM. In particular, at least parts of the crosstalk light CT may hit the light selector LS not under orthogonal incidence and not with a small incidence angle.

Consequently, the crosstalk light CT is at least partially blocked by the light selector LS and not detected by the photosensitive element P of the measurement photodetector PM. Thus, an accuracy for computing the stop time may be improved. Furthermore, a saturation of the SPAD or SPAD array of the measurement photodetector PM may be avoided.

The reference photodetector PR may be implemented as a directional photodetector according to the improved concept, in particular as described with respect to one of FIG. 5, 9 or 12.

The light emitted by the emitter E may be internally reflected by the housing H, the optical barrier B, the carrier C and/or the cover and subsequently hit the reference photodetector PR. In particular, the reflected light LR may hit the light selector LS' of the reference photodetector PR under various incident directions.

A portion of the reflected light LR hitting the light selector LS' with an incident direction within the range of passing directions of the light selector LS' may pass the light selector LS' and be detected by the photosensitive element P of the reference photodetector PR.

Another portion of the reflected light LR hitting the light selector LS' with an incident direction outside the range of passing directions of the light selector LS' may be blocked by the light selector LS'.

For example, the range of passing directions of the light selector LS' may include directions with a component pointing from the reference photodetector PR to the emitter E.

Consequently, the amount of light being detected by the reference photodetector PR is reduced avoiding a saturation of the SPAD or SPAD array of the reference photodetector PR.

In some implementations, the range of passing directions of the light selector LS' of the reference photodetector PR does not include directions pointing from the reference photodetector PR to the emission aperture or does not include all such directions. Consequently, an amount of background or ambient light entering the sensor arrangement through the emission aperture AE and being detected by the reference photodetector PR may be reduced. This may further decrease the risk of saturation of the SPAD or SPAD array of the reference photodetector PR.

The reference photodetector PR may generate a reference signal based on the detected light. The control unit computes a start time for the TOF measurement depending on the reference signal. The control unit further computes the TOF depending on the stop time and the start time. The TOF may for example correspond or correspond approximately to a time difference between the start and the stop time. This may be denoted as double-differential measurement principle.

In some implementations, only one of the reference photodetector PR and the measurement photodetector PM is implemented as a directional photodetector according to the improved concept.

The reference photodetector PR is optional. In implementations without the reference photodetector PR, the start time may be estimated or determined by a calibration of the sensor arrangement.

By using the reference photodetector PR, higher time measurement precision may be achieved by applying the double-differential measurement principle. Subtracting the start and the stop time from each other may lead directly to the TOF and may cancel out systematic errors of the response time of a driver circuit, the emitter E or a read out circuitry.

By a directional photodetector according to the improved concept, photons entering with an unwanted or undesired incident direction are blocked or filtered out. This is achieved by an angular dependent interference filter F, F' and/or a stack of metal layers MS, MS' forming channels with respective passing orientation for example in the manner of louvers. To enhance the effect, the interference filter F, F' and the louvers or stacks of metal layers MS, MS' may be stacked.

In an optical sensor arrangement according to the improved concept, one or two directional photodetectors according to the improved concept are used for example to reduce the impact of background or ambient light on the reference photodetector PR and/or to reduce the impact of crosstalk from the emitter E on the measurement photodetector PR.

The invention claimed is:

1. An optical sensor arrangement for time-of-flight measurement, the sensor arrangement comprising
    an optical emitter; and
    a measurement photodetector implemented as a directional photodetector and a reference photodetector implemented as a directional photodetector, each of the photodetectors comprising
    a photosensitive element comprising a single-photon avalanche diode (SPAD), or a SPAD array; and
    a light selector arranged on or above the photosensitive element and configured to restrict a field of view of the photosensitive element at least for light with a wavelength within a specified wavelength range by predominantly passing light with a direction of incidence within a range of passing directions of the light selector; wherein
    the measurement photodetector is arranged and configured to detect light entering the sensor arrangement through a measurement aperture in a housing of the sensor arrangement;
    the reference photodetector is arranged and configured to detect light emitted by the optical emitter and reflected by the housing;
    the range of passing directions of the light selector of the reference photodetector does not include an orthogonal direction with respect to an active surface of the reference photodetector; and
    the specified wavelength range corresponds to an emission spectrum of the emitter.

2. The optical sensor arrangement according to claim 1, wherein the light selector of the measurement photodetector comprises an interference filter with a passband, wherein a spectral position of the passband depends on an angle of incidence.

3. The optical sensor arrangement according to claim 2, wherein
    for orthogonal incidence, the interference filter has a maximum transmission value for light with a principal wavelength; and
    the range of passing directions of the light selector is at least partially defined by a shift between the principal wavelength and a characteristic wavelength of the specified wavelength range.

4. The optical sensor arrangement according to claim 1, wherein the light selector of the measurement photodetector comprises a stack of metal layers forming one or more channels through which light can pass.

5. The optical sensor arrangement according to claim 4, wherein each of the metal layers comprises metal structures and, to form the one or more channels, the metal structures of subsequent layers of the metal layers
- are arranged on top of each other; or
- are laterally shifted with respect to each other.

6. The optical sensor arrangement according to claim 1, wherein the range of passing directions of the light selector of the measurement photodetector includes an orthogonal direction with respect to an active surface of the measurement photodetector.

7. The optical sensor arrangement according to claim 1, wherein
- the light selector comprises an interference filter with a passband, wherein a spectral position of the passband depends on an angle of incidence;
- for orthogonal incidence, the interference filter has a maximum transmission value for light with a principal wavelength;
- the range of passing directions of the light selector is at least partially defined by a shift between the principal wavelength and a characteristic wavelength of the specified wavelength range; and
- the principle wavelength of the interference filter of the measurement photodetector matches the characteristic wavelength of the emission spectrum.

8. The optical sensor arrangement according to claim 1, wherein
- the light selector comprises a stack of metal layers forming one or more channels through which light can pass;
- each of the metal layers comprises metal structures; and
- to form the one or more channels, the metal structures of subsequent layers of the stack of metal layers are arranged on top of each other.

9. The optical sensor arrangement according to claim 1, wherein the range of passing directions of the light selector of the reference photodetector does not include a direction towards an emission aperture of the housing.

10. The optical sensor arrangement according to claim 1, wherein
- the light selector of the reference photodetector comprises an interference filter with a passband, wherein a spectral position of the passband depends on an angle of incidence;
- for orthogonal incidence, the interference filter has a maximum transmission value for light with a principal wavelength;
- the range of passing directions of the light selector is at least partially defined by a shift between the principal wavelength and a characteristic wavelength of the specified wavelength range; and
- the principle wavelength of the interference filter of the reference photodetector is shifted with respect to the characteristic wavelength of the emission spectrum.

11. The optical sensor arrangement according to claim 1, wherein
- the light selector of the reference photodetector comprises a stack of metal layers forming one or more channels through which light can pass;
- each of the metal layers comprises metal structures; and
- to form the one or more channels, the metal structures of subsequent layers of the metal layers of the reference photodetector are laterally shifted with respect to each other.

* * * * *